(12) United States Patent
Weidman et al.

(10) Patent No.: US 8,183,081 B2
(45) Date of Patent: May 22, 2012

(54) HYBRID HETEROJUNCTION SOLAR CELL FABRICATION USING A METAL LAYER MASK

(75) Inventors: Timothy W. Weidman, Sunnyvale, CA (US); Rohit Mishra, Santa Clara, CA (US); Michael P. Stewart, San Francisco, CA (US); Yonghwa Chris Cha, San Jose, CA (US); Kapila P. Wijekoon, Palo Alto, CA (US); Hongbin Fang, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 31 days.

(21) Appl. No.: 12/504,193

(22) Filed: Jul. 16, 2009

(65) Prior Publication Data

US 2010/0015751 A1    Jan. 21, 2010

Related U.S. Application Data

(60) Provisional application No. 61/081,362, filed on Jul. 16, 2008, provisional application No. 61/121,537, filed on Dec. 10, 2008.

(51) Int. Cl.
*H01L 21/28* (2006.01)
(52) U.S. Cl. ............ 438/72; 438/71; 438/94; 257/758; 257/773; 257/774; 257/E21.258
(58) Field of Classification Search ............ 438/71, 438/72, 94; 257/758, 773, 774, E21.258
See application file for complete search history.

(56) References Cited

U.S. PATENT DOCUMENTS

| | | | |
|---|---|---|---|
| 3,849,880 | A | 11/1974 | Haynos |
| 3,979,241 | A | 9/1976 | Maeda et al. |
| 4,084,985 | A | 4/1978 | Evans, Jr. |
| 4,104,091 | A | 8/1978 | Evans et al. |
| 4,152,824 | A | 5/1979 | Gonsiorawski |
| 4,219,448 | A | 8/1980 | Ross |

(Continued)

FOREIGN PATENT DOCUMENTS

EP    0 680 099    4/1995

(Continued)

OTHER PUBLICATIONS

Mitchell, et al. "Plasma-Enhanced Chemical Vapour Deposition of a Si:H to Provide Surface Passivation of C-SI Surfaces at Low Temperature", 22$^{nd}$ European Photovoltaic Solar Energy Conference, Sep. 3-7, 2007, Milan, Italy. pp. 928-931.

(Continued)

*Primary Examiner* — Olik Chaudhuri
*Assistant Examiner* — Walter H Swanson
(74) *Attorney, Agent, or Firm* — Patterson & Sheridan, LLP

(57) ABSTRACT

Embodiments of the invention generally provide a high efficiency solar cell using a novel processing sequence to form a solar cell device. In one embodiment, the methods include forming one or more layers on a backside of a solar cell substrate prior to the texturing process to prevent attack of the backside surface of the substrate. In one embodiment, the one or more layers are a metalized backside contact structure that is formed on the backside of the solar cell substrate. In another embodiment, the one or more layers are a chemical resistant dielectric layer that is formed over the backside of the solar cell substrate.

15 Claims, 10 Drawing Sheets

U.S. PATENT DOCUMENTS

| | | | |
|---|---|---|---|
| 4,308,091 A | 12/1981 | Schmitt et al. | |
| 4,478,879 A | 10/1984 | Baraona et al. | |
| 4,623,751 A | 11/1986 | Kishi et al. | |
| 4,717,591 A | 1/1988 | Acosta et al. | |
| 4,927,770 A | 5/1990 | Swanson | |
| 5,011,782 A | 4/1991 | Lamb et al. | |
| 5,198,385 A | 3/1993 | Devitt et al. | |
| 5,248,496 A | 9/1993 | Schuster et al. | |
| 5,281,350 A | 1/1994 | Gimm et al. | |
| 5,401,336 A | 3/1995 | Noguchi et al. | |
| 5,589,233 A * | 12/1996 | Law et al. | 427/579 |
| 5,698,451 A | 12/1997 | Hanoka | |
| 5,705,828 A | 1/1998 | Noguchi et al. | |
| 5,897,368 A | 4/1999 | Cole, Jr. et al. | |
| 5,939,336 A | 8/1999 | Yates | |
| 5,973,260 A | 10/1999 | Tange et al. | |
| 6,020,250 A | 2/2000 | Kenney | |
| 6,036,741 A | 3/2000 | Shindo et al. | |
| 6,066,267 A | 5/2000 | Rath et al. | |
| 6,082,610 A | 7/2000 | Shangguan et al. | |
| 6,091,099 A | 7/2000 | Kiyotoshi et al. | |
| 6,096,968 A | 8/2000 | Schlosser et al. | |
| 6,103,393 A | 8/2000 | Kodas et al. | |
| 6,137,178 A | 10/2000 | Park | |
| 6,290,880 B1 | 9/2001 | Ryan et al. | |
| 6,328,913 B1 | 12/2001 | Shaffer et al. | |
| 6,451,665 B1 | 9/2002 | Yunogami et al. | |
| 6,458,183 B1 | 10/2002 | Phillips et al. | |
| 6,537,461 B1 | 3/2003 | Nakahara et al. | |
| 6,552,414 B1 | 4/2003 | Horzel et al. | |
| 6,586,161 B2 | 7/2003 | Futase et al. | |
| 6,607,988 B2 | 8/2003 | Yunogami et al. | |
| 6,649,091 B2 | 11/2003 | Ryan et al. | |
| 6,649,211 B2 | 11/2003 | Lyons et al. | |
| 6,695,903 B1 | 2/2004 | Kubelbeck et al. | |
| 6,737,221 B2 | 5/2004 | Futase et al. | |
| 6,753,133 B2 | 6/2004 | Ono et al. | |
| 6,800,542 B2 | 10/2004 | Kim | |
| 6,825,104 B2 | 11/2004 | Horzel et al. | |
| 6,852,635 B2 | 2/2005 | Satta et al. | |
| 6,998,288 B1 | 2/2006 | Smith et al. | |
| 7,129,109 B2 | 10/2006 | Munzer et al. | |
| 7,135,350 B1 | 11/2006 | Smith et al. | |
| 7,242,632 B2 | 7/2007 | Hiraka | |
| 7,375,378 B2 | 5/2008 | Manivannan et al. | |
| 7,432,438 B2 | 10/2008 | Rubin et al. | |
| 7,510,672 B2 | 3/2009 | McCulloch et al. | |
| 7,741,558 B2 * | 6/2010 | Nakashima et al. | 136/256 |
| 2002/0041991 A1 | 4/2002 | Chan et al. | |
| 2002/0176927 A1 | 11/2002 | Kodas et al. | |
| 2002/0184969 A1 | 12/2002 | Kodas et al. | |
| 2003/0127124 A1 | 7/2003 | Jones et al. | |
| 2003/0134469 A1 | 7/2003 | Horzel et al. | |
| 2003/0207214 A1 | 11/2003 | Futase et al. | |
| 2004/0013799 A1 | 1/2004 | Kim et al. | |
| 2004/0063326 A1 | 4/2004 | Szlufcik et al. | |
| 2004/0112426 A1 | 6/2004 | Hagino | |
| 2004/0113277 A1 | 6/2004 | Chiras et al. | |
| 2004/0126644 A1 | 7/2004 | Bett et al. | |
| 2004/0159869 A1 | 8/2004 | Rinerson et al. | |
| 2005/0009346 A1 | 1/2005 | Miyajima | |
| 2005/0089748 A1 | 4/2005 | Ohlsen et al. | |
| 2005/0110125 A1 | 5/2005 | Blackshear | |
| 2005/0224968 A1 | 10/2005 | Ho | |
| 2005/0238808 A1 | 10/2005 | Gatineau et al. | |
| 2005/0247674 A1 | 11/2005 | Kubelbeck et al. | |
| 2005/0268963 A1* | 12/2005 | Jordan et al. | 136/256 |
| 2006/0174933 A1 | 8/2006 | Rolison et al. | |
| 2006/0283496 A1 | 12/2006 | Okamoto et al. | |
| 2006/0283499 A1 | 12/2006 | Terakawa et al. | |
| 2007/0099806 A1 | 5/2007 | Stewart et al. | |
| 2007/0111354 A1 | 5/2007 | Seong et al. | |
| 2007/0148336 A1 | 6/2007 | Bachrach et al. | |
| 2007/0181908 A1 | 8/2007 | Otremba | |
| 2007/0194467 A1 | 8/2007 | Yang et al. | |
| 2008/0076203 A1* | 3/2008 | Ribeyron et al. | 438/72 |
| 2008/0145708 A1 | 6/2008 | Heil et al. | |
| 2008/0152835 A1 | 6/2008 | Mayers et al. | |
| 2008/0210660 A1 | 9/2008 | Stockum et al. | |
| 2009/0008787 A1 | 1/2009 | Wenham et al. | |
| 2009/0068783 A1 | 3/2009 | Borden | |
| 2009/0077805 A1 | 3/2009 | Bachrach et al. | |
| 2009/0142880 A1 | 6/2009 | Weidman et al. | |
| 2010/0000597 A1* | 1/2010 | Cousins | 136/255 |

FOREIGN PATENT DOCUMENTS

| | | |
|---|---|---|
| EP | 1 390 987 | 11/2006 |
| JP | 05029639 A | 2/1993 |
| JP | 05-308148 A | 11/1993 |
| JP | 6097153 | 4/1994 |
| JP | 11-274538 A | 10/1999 |
| JP | 2002-164556 | 6/2002 |
| JP | 2003209169 A | 7/2003 |
| JP | 2007220707 A | 8/2007 |
| KR | 1020020004313 A | 1/2002 |
| KR | 10-2004-0042209 | 5/2004 |
| KR | 1020040104418 A | 12/2004 |
| KR | 10-2005-0124080 | 12/2005 |
| KR | 10-2008-0003623 | 1/2008 |
| WO | WO 02/061854 | 8/2002 |
| WO | WO 2004/021455 | 3/2004 |
| WO | WO 2004/042828 A2 | 5/2004 |
| WO | WO 2007/071064 | 6/2007 |
| WO | WO 2007/095757 | 8/2007 |
| WO | WO 2007/137407 | 12/2007 |
| WO | WO 2008/046201 | 4/2008 |
| WO | WO 2008/070087 | 6/2008 |
| WO | WO 2008/098407 | 8/2008 |
| WO | WO 2008/140224 | 11/2008 |
| WO | WO 2008/141415 | 11/2008 |
| WO | WO 2009/032734 | 3/2009 |

OTHER PUBLICATIONS

Veschetti, et al. "Fabrication of Interdigited Back Contact Solar Cells on Large Area with Screen Printed Metallization", $22^{nd}$ European Photovoltaic Solar Energy Conference, Sep. 3-7, 2007, Milan, Italy. pp. 1179-1182.

Ribeyron, et al. "Polymorphous/Crystalline Silicon Heterojunction Solar Cells: Optimisation of P-Type Monocrystalline Silicon", $22^{nd}$ European Photovoltaic Solar Energy Conference, Sep. 3-7, 2007, Milan, Italy. pp. 1197-1200.

Birmann, et al. "Fast Alkaline Etching of Monocrystalline Wafers in KOH/CHX", Presented at the $23^{rd}$ European Photovoltaic Solar Energy Conference and Exhibition, Sep. 1-5, 2008, Valencia, Spain.

Lohmann, et al. "Report on Industrial Use of Inline Wet Edge Isolation for Solar Cell Production", $22^{nd}$ European Photovoltaic Solar Energy Conference, Sep. 3-7, 2007, Milan, Italy. pp. 1634-1635.

Garben, et al. "Investigation of Boron Diffusion from Polycrystalline Silicon", IBM East Fishkill Facility, Hopewell Junction , New York 12533. Oct. 1986. pp. 2152-2156.

Uzum. et al. "Effect of Boron-Diffusion on the Electrical Properties of N-Type Multicrystalline Silicon Wafers", Proc. 23rd European Photovoltaic Solar Energy Conference, 2008/09.

Recart, et al. "Bifacial Thin Solar Cells With Screen Printed Emitters and Metallizations", 23rd European Photovoltaic Solar Energy Conference and Exhibition, Sep. 1-5, 2008, Valencia, Spain. Session: 2DV.1.16. pp. 1893-1896.

Vitanov, et al. "A Study of Sol-Gel Deposited Al2O3 Films as Passivating Coatings for Solar Cells Application", 23rd European Photovoltaic Solar Energy Conference and Exhibition, Sep. 1-5, 2008, Valencia, Spain. Session: 2CV.5.5. pp. 1596-1599.

Kohler, et al. "New Inkjet Solution for Direct Printing of Local Diffusion Barriers on Solar Cells", $23^{rd}$ EUPVSEC (Valencia, Spain), 2008.

Morilla, et al. "Laser Induced Ablation and Doping Processes on High Efficiency Silicon Solar Cells", 23rd EUPVSEC (Valencia, Spain), 2008.

PCT International Search Report and Written Opinion, dated Apr. 21, 2010 for International Application No. PCT/US2009/059453.

PCT International Search Report and Written Opinion dated Jan. 11, 2010 for International Application No. PCT/US2009/050808.

Paunovic, Milan "Electrochemically Deposited Thin Films" The Electrochemical Society, Inc., Electrodeposition Division Proceedings vol. 94-31. pp. 293-303. 1995.

Shacham-Diamand, et al. "Integrated Electroless Metallization for ULSI" Electrochimica Acta 44 (1999) 3639-3649.

Sankar, et al. "Low Temperature Chemical Vapour Deposition of Ruthenium and Ruthenium Dioxide on Polymer Surfaces" Journal of Materials Chemistry 9 (1999), 2439-2444.

Swider-Lyons, et al. "Selective Vapor Deposition of Hydrous RuO2 Thin Films", Journal of The Electrochemical Society, 152-3 (2005) C158-C162.

Shih, C.H., et al. "Direct Plating of Cu on ALD TaN for 45nm-node Cu BEOL Metallization". IEEE, 2004.

Herlitz, Fredrik "Titanium in the electrochemical industry—use and protection" Permascand AB, Sweden 2004.

Lindholm, et al. "Heavily Doped Polysilicon-Contact Solar Cells," IEEE Electron Device Letters, vol. EDL—6, No. 7, Jul. 1985.

Buhler, et al. "Silicon Dioxide Sacrificial Layer Etching in Surface Micromachining," 1997. Physical Electronics Laboratory.

Lennon, et al. "Direct Patterned Etching of Silicon Dioxide and Silicon Nitride Dielectric Layers," Solar Energy Materials & Solar Cells. 2009.

SolarEtch. "New Structuring Concepts for Solar Cell Production Easy, Fast and Environmentally Friendly", www.isishape.com. Published Feb. 2003.

Colomer, et al., "Structural, Microstructural, and Electrical Transport Properties of TiO2—RuO2 Ceramic Materials Obtained by Polymeric Sol-Gel Route," Chem. Mater. 2000, 12, pp. 923-930.

Denissov, et al. "RIE—Textured Silicon Solar Cells with Screen Printed Metallization", p. 64-66. 2003.

Curtis, C. J. et al., "Direct-Write Printing of Silver Metallizations on Silicon Solar Cells", Materials Research Society 2002, Mat. Res. Soc. Symp. Proc. vol. 730, pp. V3.8.1-V3.8.6.

Erler, et al. "Solar Cell Processing Steps Applied to RIE Textured Silicon Surfaces." Chemnitz University of Technology, Center for Microtechnologies Annual Report. 2002.

Bueno, et al. "Simultaneous Diffusion of Screen Printed Boron and Phosphorus Paste for Bifacial Silicon Solar Cells", 2004.

Huljic, et al. "Development of a 21% Back Contact Monocrystalline Silicon Solar Cell for Large-Scale Production", 2008.

Isishape. "Structuring Solutions for economical and environmentally-friendly processes for solar cell and display fabrication", Jul. 14, 2009.

PCT International Search Report and Written Opinion dated Dec. 27, 2010 for International Application No. PCT/US2009/050811.

* cited by examiner

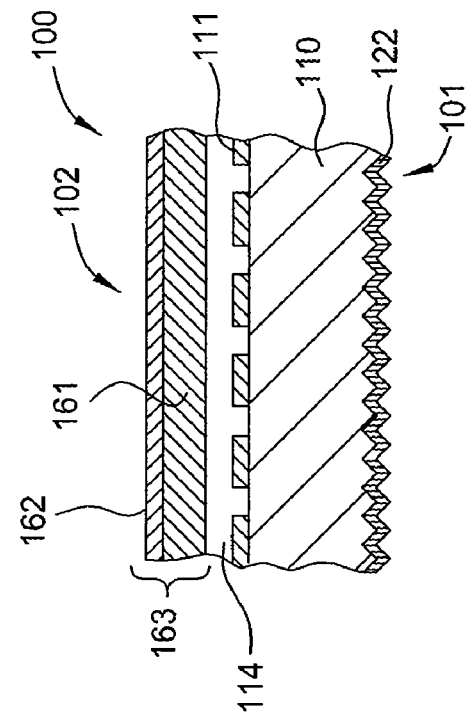
FIG. 1E
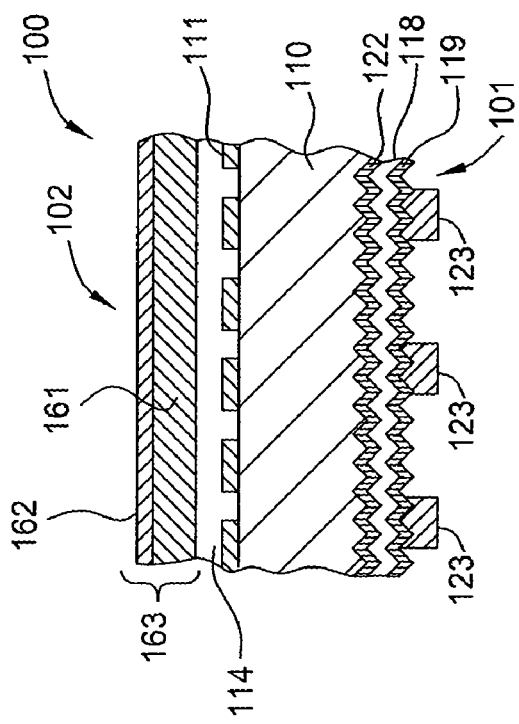
FIG. 1F
FIG. 1G
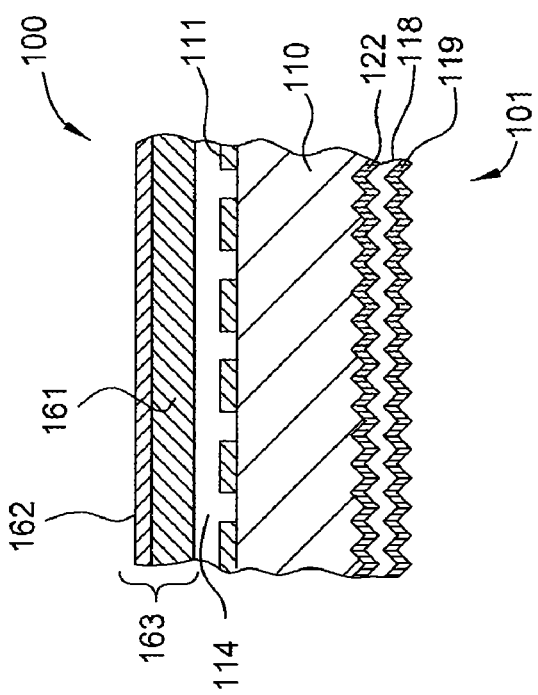
FIG. 1H

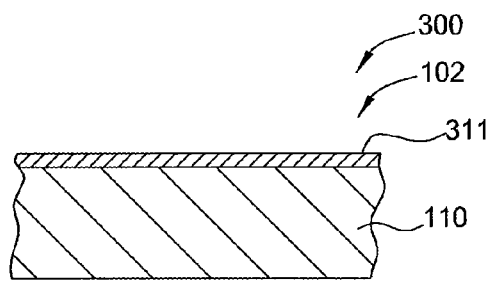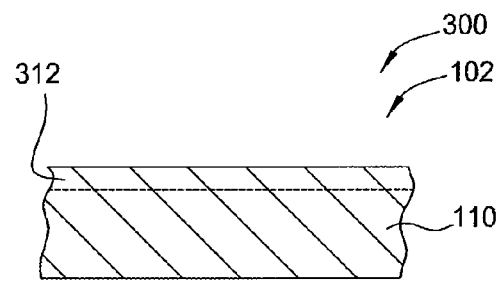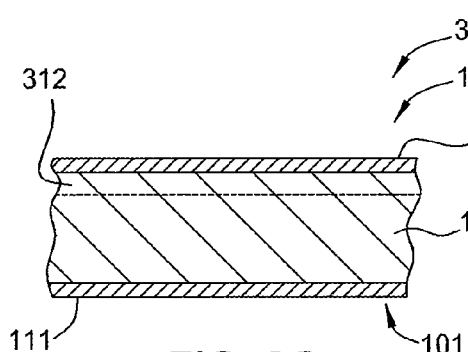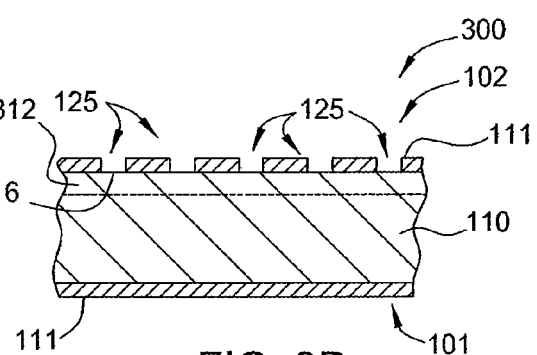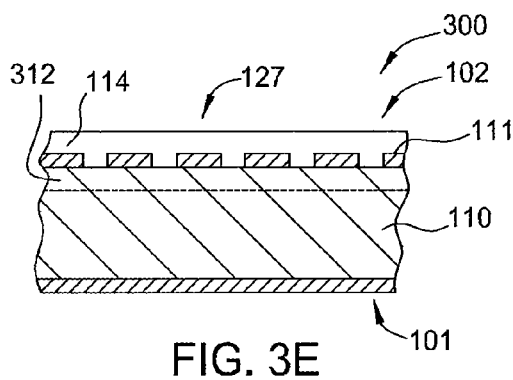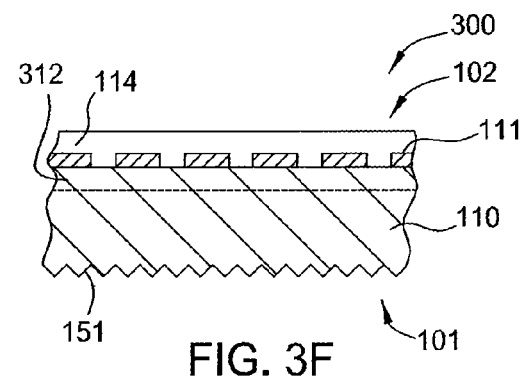

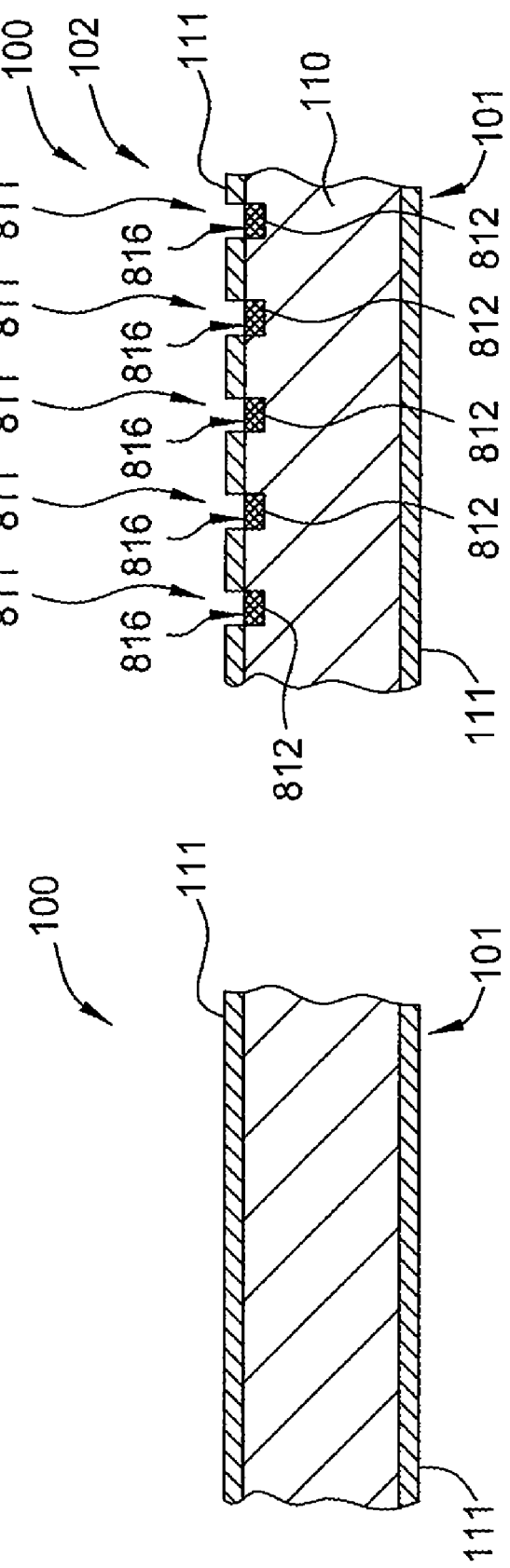

HYBRID HETEROJUNCTION SOLAR CELL FABRICATION USING A METAL LAYER MASK

CROSS-REFERENCE TO RELATED APPLICATIONS

This application claims benefit of U.S. Provisional Patent Application Ser. No. 61/081,362, filed Jul. 16, 2008, and Provisional Patent Application Ser. No. 61/121,537, filed Dec. 10, 2008, which are both herein incorporated by reference in their entirety. This application is also related to U.S. patent application Ser. No. 12/504,216, filed Jul. 16, 2009.

BACKGROUND OF THE INVENTION

1. Field of the Invention

Embodiments of the invention generally relate to the fabrication of photovoltaic cells.

2. Description of the Related Art

Solar cells are photovoltaic devices that convert sunlight directly into electrical power. The most common solar cell material is silicon, which is in the form of single or multicrystalline substrates, sometimes referred to as wafers. Because the amortized cost of forming silicon-based solar cells to generate electricity is higher than the cost of generating electricity using traditional methods, there has been an effort to reduce the cost to form solar cells.

Various approaches enable fabricating active regions of the solar cell and the current carrying metal lines, or conductors, of the solar cells. However, there are several issues with these prior manufacturing methods. For example, the formation processes are complicated multistep processes that add to costs required to complete the solar cells.

Therefore, there exists a need for improved methods and apparatus to form the active and current carrying regions formed on a surface of a substrate to form a solar cell.

SUMMARY OF THE INVENTION

The present invention generally provides a method of forming a solar cell device, comprising forming a first dielectric layer on a back surface of a substrate, removing portions of the first dielectric layer from the back surface to from a plurality of exposed regions of the substrate, depositing a first metal layer over the back surface of the substrate, wherein the metal layer is in electrical communication with at least one of the exposed regions of the substrate, and texturing a front surface of the substrate after depositing the first metal layer.

In one another embodiment, the present invention generally provides a method of forming a solar cell device, comprising forming a doping layer on a back surface of a substrate, heating the doping layer and the substrate to a temperature greater than about 800° C., forming a first dielectric layer on the back surface of the substrate, removing portions of the first dielectric layer from the back surface of the substrate to form a plurality of exposed regions of the substrate, depositing a first metal layer over the back surface of the substrate, wherein the metal layer is in electrical communication with at least one of the plurality of exposed regions on the substrate, and texturing a front surface of the substrate after depositing the first metal layer.

In yet another embodiment, the present invention generally provides a system that is adapted to form a solar cell, comprising a first processing module that is adapted to deposit a dielectric layer on a first surface of a substrate, a second processing module that is adapted to deposit an etchant material on the dielectric layer, a third processing module that is adapted to heat the substrate, a fourth processing module that is adapted to deposit a metal layer on the dielectric layer, a fifth processing module that is configured to retain a texture etch solution that is used to form a texture on a second surface of the substrate that is opposite the first surface, and a plurality of automation devices that is adapted to deliver the substrate to the first, second, third, fourth and fifth processing modules.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

FIGS. 1A-1H illustrate schematic cross-sectional views of a solar cell during different stages in a sequence according to one embodiment of the invention.

FIGS. 3A-3J illustrate schematic cross-sectional views of a solar cell during different stages in a sequence according to one embodiment of the invention.

FIGS. 8A and 8B illustrate schematic cross-section views of a solar cell during different stages in an alternative processing sequence performed to form a desired pattern on the backside surface of a solar cell device.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention contemplate the formation of a high efficiency solar cell using a novel processing sequence to form a solar cell device. In one embodiment, the method generally includes the steps of forming one or more layers on a backside of a solar cell substrate to prevent the backside of the solar cell substrate from being attacked during the subsequent process, and provide a stable supporting surface, when the front side regions of a solar cell are formed. In one embodiment, the one or more layers are a metalized backside contact structure that is formed on the backside of the solar cell substrate. In one another embodiment, the methods include the use of various etching and patterning processes that are used to define active regions of the device and regions where the device and/or contact structure is to be located on a surface of a solar cell substrate. Solar cell substrates (e.g., substrate 110 in FIG. 1A) that may benefit from the invention include substrates that may have an active region containing organic material, single crystal silicon, multi-crystalline silicon, polycrystalline silicon, germanium (Ge), gallium arsenide (GaAs), cadmium telluride (CdTe), cadmium sulfide (CdS), copper indium gallium selenide (CIGS), copper indium selenide ($CuInSe_2$), gallilium indium phosphide ($GaInP_2$), as well as heterojunction cells, such as GaInP/GaAs/Ge or ZnSe/GaAs/Ge substrates, that are used to convert sunlight to electrical power. In one embodiment, the substrate 110 is a crystalline silicon substrate, such as a monocrystalline substrate (e.g., Si<100> or Si<111>), a microcrystalline silicon substrate, multicrystalline silicon substrate, polycrystalline silicon substrate, or a doped or undoped polysilicon substrate.

Metallized Backside Contact Solar Cell Formation Process

Figure 1B:
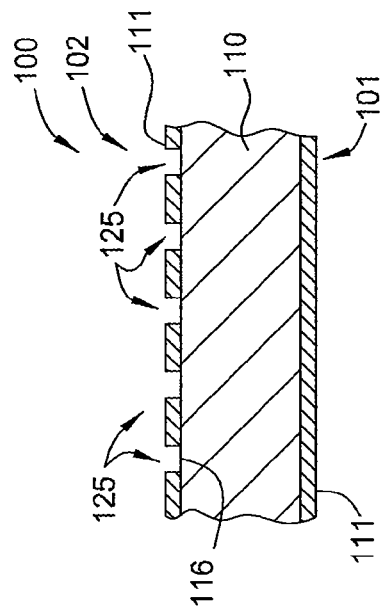
Figure 1D:
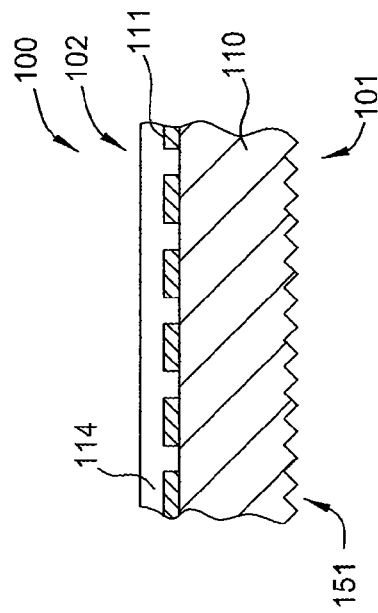
Figure 7:
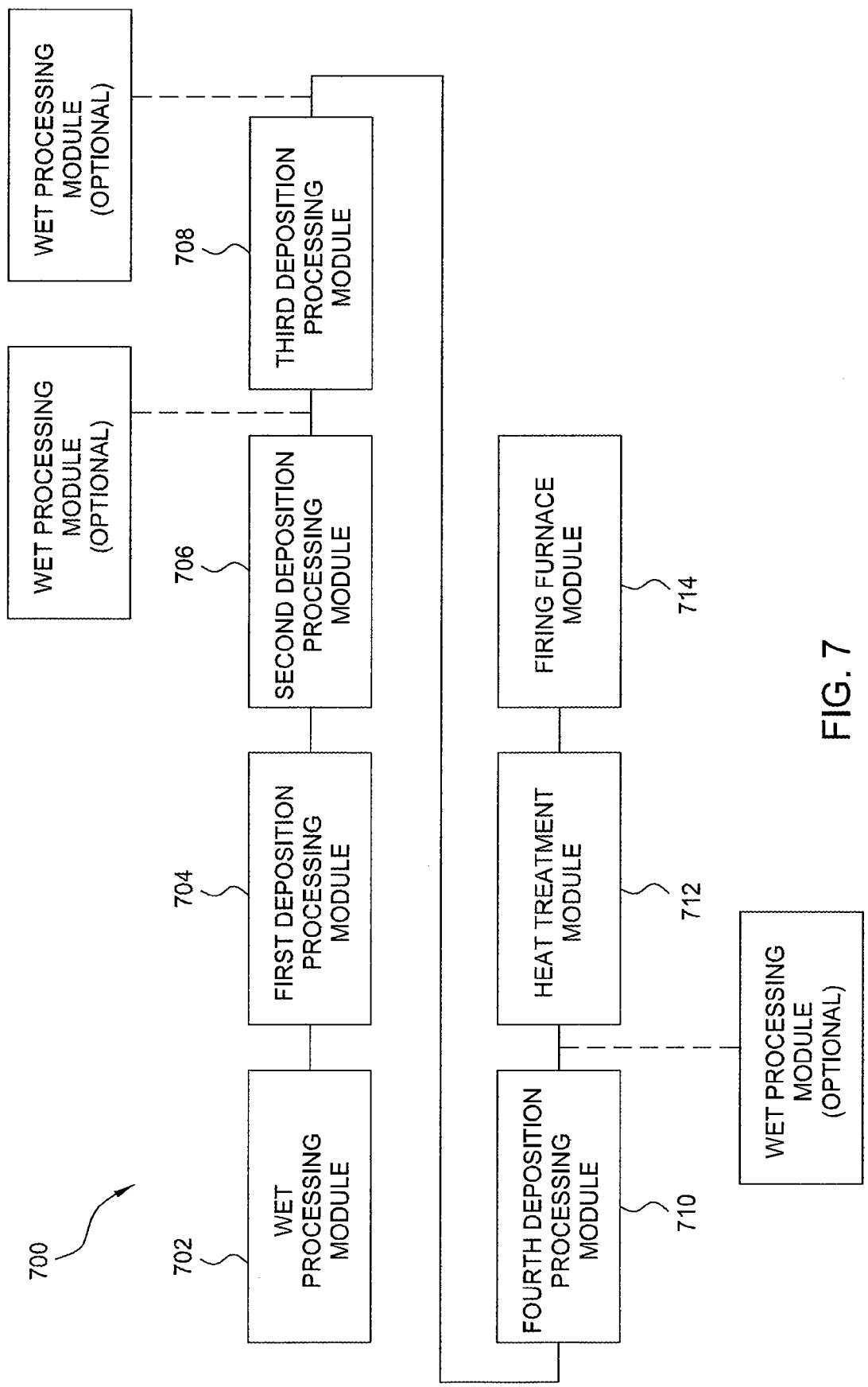
FIG. 7 illustrate a flow chart of a solar cell production line that is adapted to perform processing steps of forming a solar cell device.

FIGS. 1A-1H illustrate schematic cross-sectional views of a solar cell substrate 110 during different stages in a processing sequence used to form a contact structure on a back surface 102 of the solar cell 100. FIG. 2 illustrates a process sequence 200 used to form the active region(s) and/or contact structure on a solar cell. The sequence shown in FIG. 2 corresponds to the stages depicted in FIGS. 1A-1H, which are discussed herein. FIG. 7 is a flow chart of a solar cell production line 700 that is adapted to perform the processing steps illustrated in FIG. 2. It should be noted that the number and sequence of steps illustrated in FIGS. 2 and 7 are not intended to limiting as to the scope of the invention described herein, since one or more steps or modules can be added, deleted and/or reordered without deviating from the basic scope of the invention described herein. In general, the bulk of the movement of the a substrate through the production line 700 is performed by use of a plurality of automation devices that are adapted to move and position the one or more substrates 110 so that they can be received by, or positioned within, one or more of the processing modules (e.g., reference numerals 702-714) by use of commands sent by a system controller. In one embodiment, the automation devices define a substrate processing flow path along which each of the processing modules are disposed so that the automation device can serially transfer one or more substrates to each of the processing modules. In general, the system controller is a general use computer that is used to control one or more components found in the solar cell production line 700. The system controller is generally designed to facilitate the control and automation of the overall solar cell production line 700 and typically includes a central processing unit (CPU) (not shown), memory (not shown), and support circuits (or I/O) (not shown). Software instructions and data can be coded and stored within the memory for instructing the CPU. A program (or computer instructions) readable by the system controller determines which tasks are performable on a substrate. Preferably, the program is software readable by the system controller that includes code to perform tasks relating to monitoring, execution and control of the movement, support, and/or positioning of a substrate along with the various process recipe tasks and various processing module process recipe steps being performed in the solar cell production line 700. The automation devices may generally comprise a robotic device or conveyor that is adapted to move and position a substrate. In one example, the automation device is a series of interconnected conventional substrate conveyors (e.g., roller type conveyor), motor driven belts, and/or robotic devices (e.g., 6-axis robot, SCARA robot) that are configured to move and position the substrate as desired within and/or in positions between the processing modules.

At box 202, as shown in FIG. 2, an optional clean process is performed to remove any undesirable material or roughness from the surfaces of the substrate 110. In one embodiment, the clean process may be performed using a batch cleaning process in which the substrates are exposed to a cleaning solution. In one embodiment, the substrates are wetted by spraying, flooding, immersing of other suitable technique. The clean solution may be an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning solution. The cleaning process may be performed on the substrate between about 5 seconds and about 600 seconds, such as about 30 seconds to about 240 seconds, for example about 120 seconds. An example of an exemplary cleaning process is further disclosed in detail in U.S. patent application Ser. No. 12/383,350, entitled "SURFACE CLEANING AND TEXTURING PROCESS FOR CRYSTALLINE SOLAR CELLS", filed on Mar. 23, 2009, which is incorporated herein by reference in its entirety.

The cleaning process described in box 202 may be performed in a wet processing module 702 that is positioned within the solar cell production line 700, as shown in FIG. 7. In one embodiment, the wet processing module 702 generally comprises a system controller, a mainframe, and robotic device that are adapted to transfer substrates between the plurality of processing chambers disposed within the mainframe to perform cleaning process(es) described herein. In one embodiment, the robotic device is adapted to transfer a batch, or cassette, of substrates that are to be processed all at the same time in each of the processing chambers. An example of an exemplary wet processing module 702 is further disclosed in detail in U.S. patent application Ser. No. 12/383,350, which is incorporated herein by reference above.

Figure 1A:
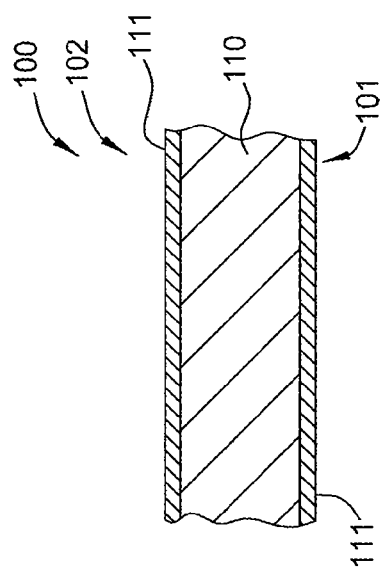
Figure 2:
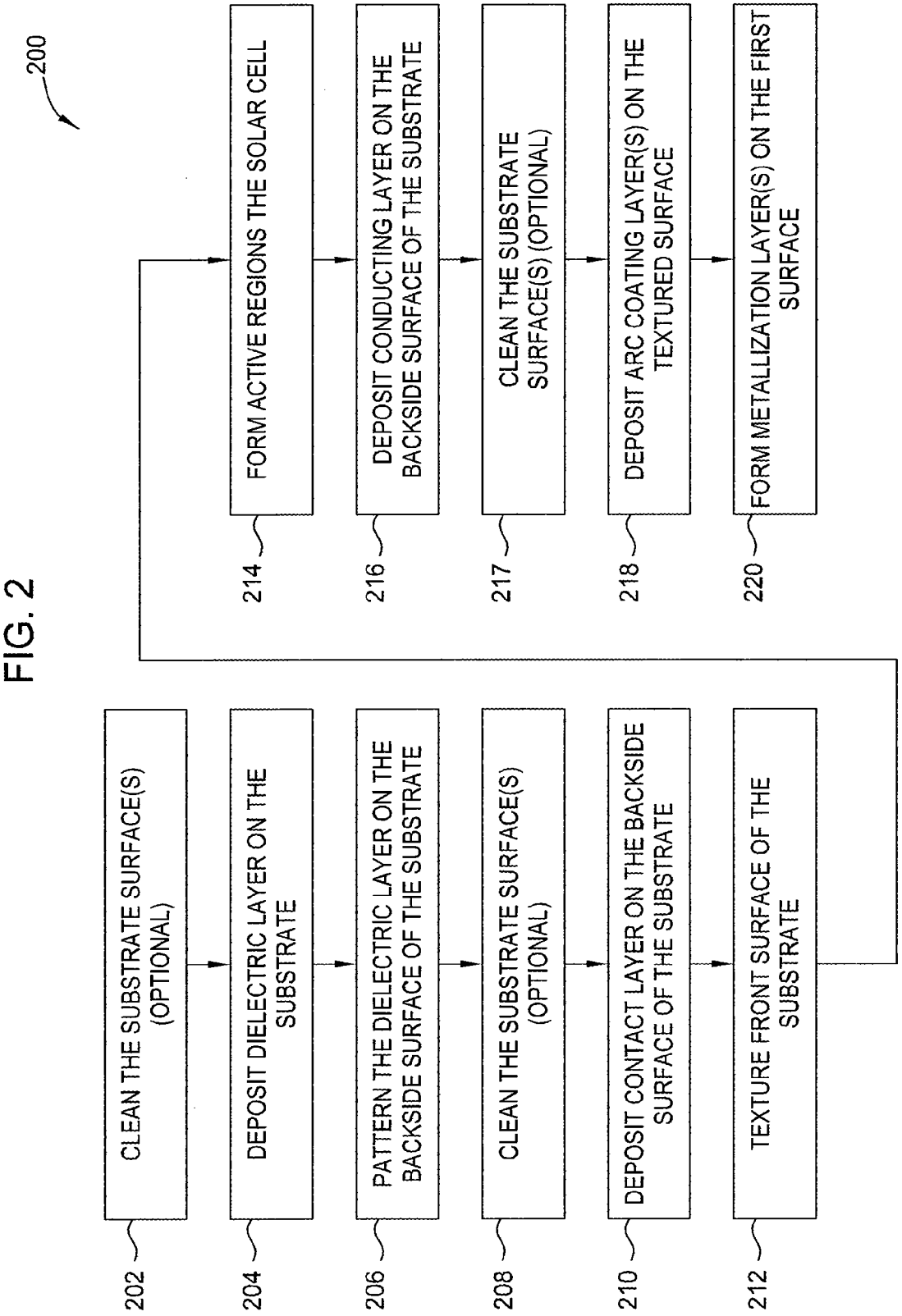
FIG. 2 illustrates a flow chart of methods to metalize a solar cell according to embodiments of the invention.
Figure 3G:
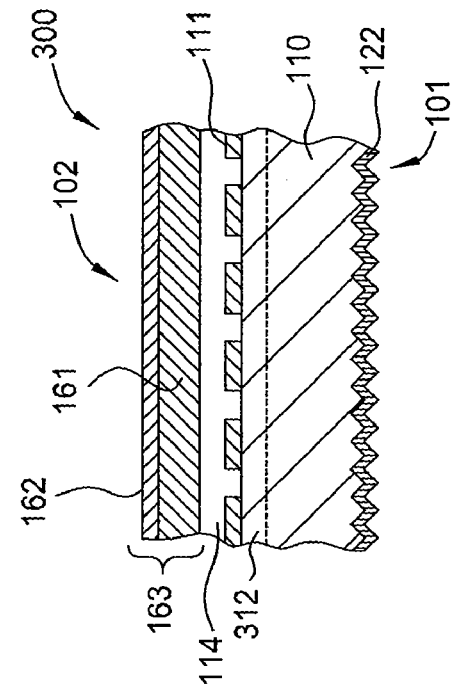
Figure 3H:
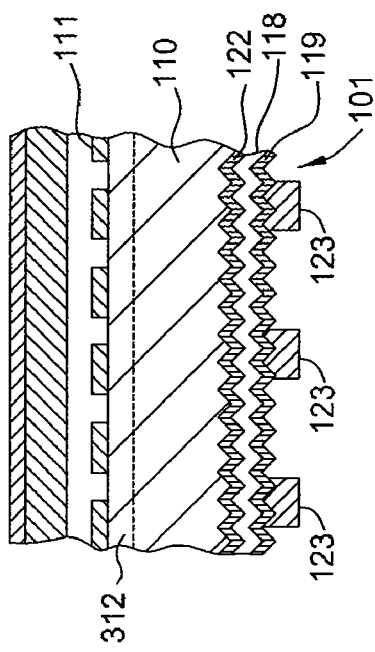
Figure 3I:
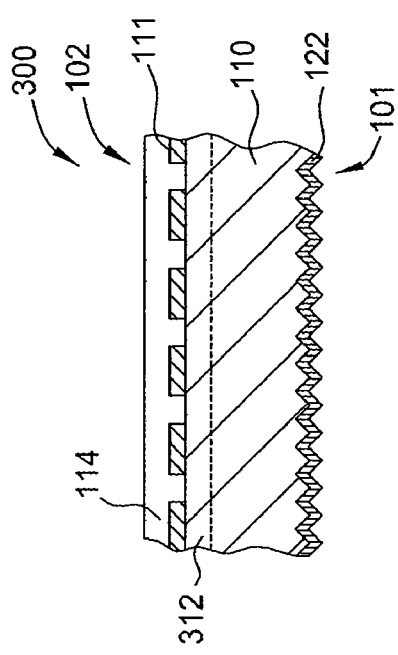
Figure 3J:
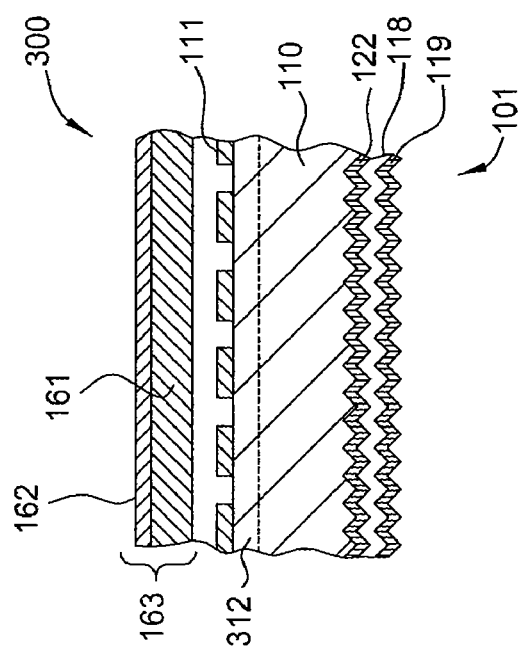

At box 204, as shown in FIGS. 1A and 2, a dielectric layer 111 is formed on a front surface 101 and a back surface 102 of the substrate 110. The dielectric layer 111 is formed over the substrate 110 to generally provide electric isolation between a conducting layer 163 (formed in the subsequent process) and the back surface 102 of the substrate 110. In one embodiment, the dielectric layer 111 is a silicon oxide layer formed on the front surface 101 and back surface 102 of a silicon containing substrate. The silicon oxide containing dielectric layer 111 may be formed using a conventional thermal oxidation process, such a furnace annealing process, a rapid thermal oxidation process, an atmospheric pressure or low pressure CVD process, a plasma enhanced CVD process, a PVD process, an evaporation technique, or applied using a sprayed-on, spin-on, roll-on, screen printed, or other similar type of deposition process. In one embodiment, the dielectric layer 111 is a silicon dioxide layer that is between about 50 Å and about 3000 Å thick. It should be noted that the discussion of the formation of a silicon oxide type dielectric layer is not intended to be limiting as to the scope of the invention described herein since the dielectric layer 111 could also be formed using other conventional deposition processes (e.g., PECVD deposition) and/or be made of other dielectric materials, for example, silicon carbide ($SiC_x$), silicon nitride ($SiN_x$), or aluminum oxide ($AlO_x$). Deposition of dielectric layer 111 on the front surface 101 may be helpful when forming the backside contact structure since it can act as a stable support surface that will not be as easily scratched or damaged during the handling steps performed during these processes.

The deposition of the dielectric layer described in box 204 may be performed by a first deposition processing module 704 that is positioned within the solar cell production line 700, as shown in FIG. 7. In one embodiment, the first deposition processing module 704 is positioned along the processing flow path, which is formed by the automation devices, downstream of the optional wet processing module 702. The first deposition processing module 704 may include but is not limited to physical vapor deposition (PVD) chambers, sputtering chambers, chemical vapor deposition (CVD) chambers, plasma enhanced chemical vapor deposition (PECVD) chambers. In one embodiment, the first deposition processing module 704 is a AKT™ series PECVD chamber available from Applied Materials, Inc., located in Santa Clara, Calif. It is contemplated that other processing chambers, such as hot wire chemical vapor deposition (HWCVD) chambers, or atomic layer deposition (ALD) chambers, may also be used to practice the present invention.

In box 206, as shown in FIGS. 1B and 2, the dielectric layer 111 formed on the back surface 102 of the substrate is etched by conventional means to form a desired pattern of exposed regions 125 that can be used to form a connection between a backside contact structure 127 (FIG. 1C) and a substrate surface 116. Typical etching processes that may be used to form the patterned exposed regions 125 on the back surface 102 may include but are not limited to patterning and dry etching techniques, laser ablation techniques, patterning and wet etching techniques, or other similar processes that may be used form a desired pattern in the deposited dielectric layer 111. The exposed regions 125 generally provide surfaces through which electrical connections can be made to the back surface 102 of the substrate 110.

In one embodiment of the processes performed at box 206, an etchant material is selectively deposited on the dielectric layer 111 by use of a conventional ink jet printing, rubber stamping, screen printing, or other similar process to form and define the desired regions where the active regions and/or contact structure are to be formed. In one embodiment, etchant material is an ammonium fluoride ($NH_4F$) containing material that is formulated to etch the dielectric layer 111. In one example, the etchant material contains: 200 grams/liter (g/l) of ammonium fluoride ($NH_4F$), 50 g/l of 2000 MW polyethylene glycol (PEG) and 50 g/l of ethyl alcohol with the remainder of the 1 liter volume being DI water. In another example, one liter of the etchant material contains: 90 milliliters of a 6:1 buffered oxide etch (BOE) etching solution, 5 grams of 500 MW polyethylene glycol (PEG) and 5 grams of ethyl alcohol with the remainder of the volume being DI water. In one example, the BOE etching solution comprises a 6:1 volume ratio of 40% $NH_4F$ in water to 49% HF in water. Additional components in the etching solution are generally selected so as to promote effective "wetting" of the dielectric layer 111 while minimizing the amount of spreading that can affect the formed pattern in the dielectric layer 111. While polyethylene oxide (i.e., polyethylene glycol) based materials and other related materials work well as a surfactant in the etchant solution, they also decompose at temperatures over 250° C. to form volatile byproducts thereby avoiding the need for a post-rinse step to clean the substrate surface after heating the substrate in the next step. After the etchant material has been deposited in a desired pattern on the back surface 102, the substrate is then heated to a temperature of between about 200° C. and about 300° C. which causes the chemicals in the etchant material to etch the dielectric layer 111 formed on the substrate, thereby forming the exposed regions 125 on the substrate 110. It is believed that by exposing a silicon oxide containing dielectric layer 111 (e.g., 1000 Å thick) to an etchant material that contains ammonium fluoride ($NH_4F$), such as the formulation discussed above, at a temperature in a range between 200° C. and about 300° C. for about 2 minutes, the dielectric layer 111 is etched to produce volatile etch products which evaporate from the exposed region 125 of the substrate 110 during processing. Therefore, after processing for a desired period of time (e.g., ~2 minutes) at a desired temperature, the volatile etch products will be removed and a clean surface is left within the exposed regions 125 so that a reliable backside electrical contact can be formed in these areas. It is believed that the reaction will follow the following equation (1):

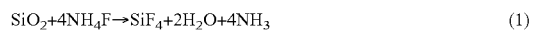

$$SiO_2 + 4NH_4F \rightarrow SiF_4 + 2H_2O + 4NH_3 \qquad (1)$$

FIG. 1B illustrates the patterned dielectric layer 111 formed after performing boxes 202-206 shown in FIG. 2. One desirable aspect of using this alternate version of box 206 is its ability to form the exposed regions 125 in the dielectric layer 111 without the need to perform any post cleaning processes due to the removal of the etching products and residual etchant material by evaporation, thus leaving a clean surface that can be directly metalized in the following processes at box 210. One another embodiment of the patterning processes that may be used to replace the process performed at box 206 is illustrated in FIG. 8 and discussed further below in the subsequent section entitled "Alternative Processing Sequence."

The patterning process described in box 206 may be performed by a second deposition processing module 706 that is positioned within the solar cell production line 700, as shown in FIG. 7. In one embodiment, the second deposition processing module 706 is positioned along the processing flow path downstream of the first deposition processing module 704. In one embodiment, the etchant material is selectively deposited on the dielectric layer using a screen printing process performed in a Softline™ tool available from Baccini S.p.A., which is owned by Applied Materials, Inc. of Santa Clara, Calif. An example of an exemplary second deposition processing module 706 is further disclosed in detail in U.S. Provisional Patent Application Ser. No. 61/102,310, entitled "NEXT GENERATION SCREEN PRINTING SYSTEM", filed on Oct. 2, 2008, and U.S. Patent Publication No. 2009/0142880, entitled "SOLAR CELL CONTACT FORMATION PROCESS USING A PATTERNED ETCHANT MATERIAL," filed on Nov. 19, 2008, which are both incorporated herein by reference in their entirety.

In one embodiment, an optional cleaning process, shown in box 208, is performed on the substrate 110 after the process performed in box 206 has been completed to remove any undesirable residue and/or form a passivated surface. In one embodiment, the clean process may be performed by wetting the substrate with a cleaning solution that is used to remove left over material from after box 206 and clean the surface of the substrate before the subsequent deposition sequence performed on the various regions of the substrate. Wetting may be accomplished by spraying, flooding, immersing or other suitable techniques. The post etch-clean solution may be an SC1 cleaning solution, an SC2 cleaning solution, a dilute HF-last type cleaning solution, an ozonated water solution, a dilute ammonium hydroxide ($NH_4OH$) solution, a hydrogen peroxide ($H_2O_2$) solution, DI water or other suitable and cost effective cleaning process may be used to clean a silicon containing substrate. In one embodiment, the post etch-clean solution is a hydrofluoric (HF) and ozone ($O_3$) mixture. The post etch-clean process may be performed on the substrate between about 5 seconds and about 600 seconds, such as about 30 seconds to about 240 second, for example about 120 seconds.

The optional cleaning process described in box 208 may be performed in portions of a wet processing module 702 that is positioned within the solar cell production line 700, as discussed previously and shown in FIG. 7. In one embodiment, the wet processing module 702 is positioned along the processing flow path downstream of the second deposition processing module 706 used to perform the process at box 206. An example of an exemplary wet processing module 702 is further disclosed in detail in the U.S. patent application Ser. No. 12/383,350, which is incorporated herein by reference above.

Figure 1C:
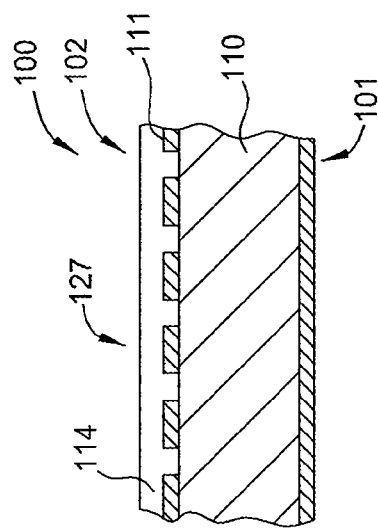

In box 210, as illustrated in FIG. 1C, a contact layer 114 is deposited on the back surface 102 of the substrate 110 to form buss lines that electrically connect the exposed regions on the surface of the substrate 110. In one embodiment, the formed contact layer 114 is between about 2000 angstroms (Å) and about 50,000 angstroms (Å) thick and contains a metal, such as copper (Cu), silver (Ag), gold (Au), tin (Sn), cobalt (Co), rhenium (Rh), nickel (Ni), zinc (Zn), lead (Pb), palladium (Pd), tungsten (W), titanium (Ti), tantalum (Ta), molybdenum (Mo) and/or aluminum (Al). In one example, the formed contact layer 114 may comprise a metal alloy, such as titanium nitride (TiN), titanium tungsten (TiW), tantalum nitride (TaN), or nickel vanadium (NiV).

In one embodiment, the contact layer 114 contains a metal that is selected so that it will not be chemically attacked during the subsequent front surface 101 texturing process, as discussed below. In one embodiment, the formed contact layer 114 is between about 2000 angstroms (Å) and about 50,000 angstroms (Å) thick and primarily comprises a refractory metal, such as titanium (Ti), tantalum (Ta), tungsten (W), molybdenum (Mo), titanium nitride (TiN), tantalum nitride (TaN), tungsten nitride (WN), and/or molybdenum nitride (MoN). In another embodiment, the exposed surface of the contact layer 114 contains a refractory metal or metal alloy, such as, titanium (Ti), tantalum (Ta), tungsten (W), molybdenum (Mo), titanium nitride (TiN), tantalum nitride (TaN), tungsten nitride (WN), and/or molybdenum nitride (MoN). In another embodiment, the contact layer 114 contains two layers that are formed by first depositing a conductive material layer, such as aluminum (Al) layer (not shown) by a physical vapor deposition (PVD) process or an evaporation process, and then depositing a refractory metal layer, such as a tantalum nitride (TaN) capping layer (not shown) by use of a PVD deposition process. In this configuration, the TaN layer is used to mask the aluminum layer that may be attacked during the subsequent texturing process.

The deposition of the contact layer described in box 210 may be performed by a third deposition processing module 708 that is positioned within the solar cell production line 700, as shown in FIG. 7. In one embodiment, the third deposition processing module 708 is positioned along the processing flow path downstream of the wet processing module 702 used to perform the process at box 208. In one embodiment, the contact layer 114 is formed on one or more surfaces of the solar cell substrate using sputtering process performed in an ATON™ tool available from Applied Materials in Santa Clara, Calif. Other processing chambers, such as a chemical vapor deposition chamber, hot wire chemical vapor deposition (HWCVD) chamber, or atomic layer deposition (ALD) chamber may also be used to practice the present invention. Alternatively, the deposition process described in box 210 may also be performed by the second deposition processing module 706 that is positioned within the solar cell production line 700 shown in FIG. 7, as described above.

At box 212, as shown in FIGS. 1D and 2, a texturizing process is performed on the front surface 101 of the substrate 110 to form a textured surface 151, thereby promoting light trapping in the solar cells to improve conversion efficiency. In one embodiment, the front surface 101 of the substrate 110 is the side of a solar cell substrate that is adapted to receive sunlight after the solar cell has been formed. As an example, in one texturing process the substrate is immersed in a standard BOE etch chemistry, then an alkaline etching chemistry (e.g., KOH chemistry), and then a dilute HF cleaning chemistry. In one example, the substrate is etched in an etching solution comprising between about 2.7% by volume of potassium hydroxide (KOH) and about 4500 ppm of 300 MW PEG that is maintained at a temperature of about 79° C.-80° C. for about 30 minutes. In one example, the BOE etching solution comprises a 6:1 volume ratio of 40% $NH_4F$ in water to 49% HF in water. In one embodiment, the etching solution for etching a silicon substrate may be an aqueous potassium hydroxide (KOH), sodium hydroxide (NaOH), aqueous ammonia ($NH_4OH$), tetramethylammonium hydroxide (TMAH; or $(CH_3)_4NOH$), or other similar basic solution. The etching solution will generally anisotropically etch the substrate, thereby providing a textured front surface 101 of the substrate 110, as depicted in FIG. 1D. In one embodiment, in which the substrate 110 is a crystalline silicon substrate (e.g., monocrystalline), the etch rate along the Si<111> orientation is relatively slow. As a result, the substrate 110 is etched selectively in the Si<100> orientation along the Si<111> side, forming pyramids on the textured surface 151. The roughness of the textured surface 151 may be determined by the shape, height, dimension and depth of the random pyramids formed on the textured surface 151 by etching. In one example, the average depth of the texture is defined as the average difference between the peak to valley, or average height, as measured over an area or region of the substrate surface by use of a mechanical profilometer, optical profilometer or other optical inspection techniques (e.g., confocal microscopy, 3D-SEM image). In one embodiment, the average height of the texture formed during a texturing process is between about 1 μm and about 10 μm. The texturizing process described in box 212 may be performed by the wet processing module 702 that is positioned within the solar cell production line 700, as discussed previously and shown in FIG. 7. In one embodiment, the texturizing process described in box 212 may be performed by the wet processing module 702 that is positioned downstream of the third deposition processing module 708 used to perform the process at box 210, as discussed previously and schematically illustrated in FIG. 5. An example of an exemplary texturizing process is further described in the patent application Ser. No. 12/383,350, filed on Mar. 23, 2009, which is incorporated by reference above.

In cases where the active regions (e.g., PV junction) of the solar cell substrate have not yet been formed, the process sequence 200 then will include the box 214 in which one or more steps may be performed to create the active region 122 of the solar cell device (FIG. 1E). In one example, a conventional solar cell is formed by performing a standard conventional doping and drive-in steps. In this configuration the contact layer 114 will need to be selected so that it will not be adversely affected by the exposure to the processing temperatures required to perform the standard conventional doping and drive-in steps (i.e., use of refractory metals may be required). In another example, a heterojunction type solar is formed by depositing an intrinsic silicon containing layer and then depositing a doped silicon containing layer on the front surface 101 of the substrate 110 by conventional means. In one example, the front surface 101 of the substrate 110 is doped using a high temperature diffusion furnace type processing step (e.g., processing temperature≧800° C.), in which components of a doping gas (e.g., trimethyl-borane (TMB), $POCl_3$) are driven into the exposed front surface 101 of the substrate. In this configuration the contact layer 114 acts as a shield that protects the back surface 102 of the substrate 110.

Figure 5A:
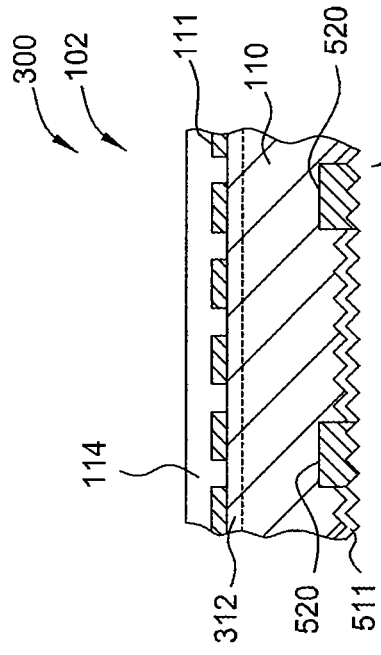
FIGS. 5A-5D illustrate schematic cross-sectional views of a solar cell substrate during different stages in a processing sequence performed to form active regions of a solar cell device.
Figure 5B:
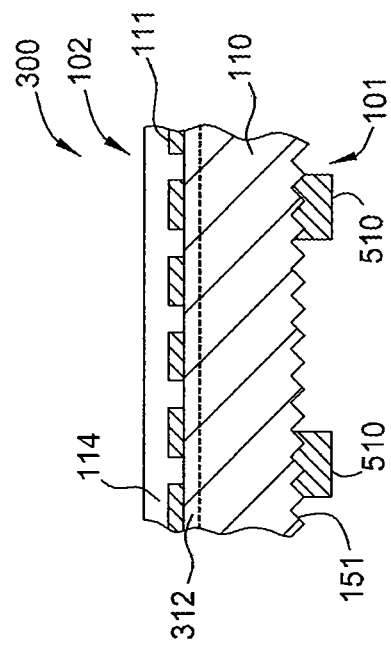
Figure 5C:
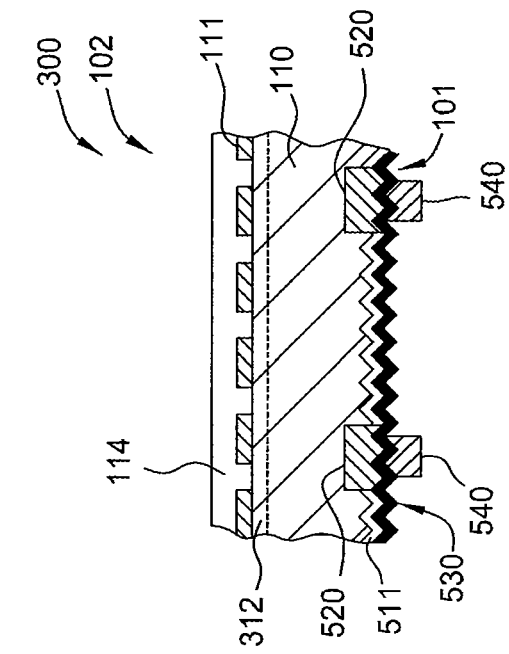
Figure 5D:
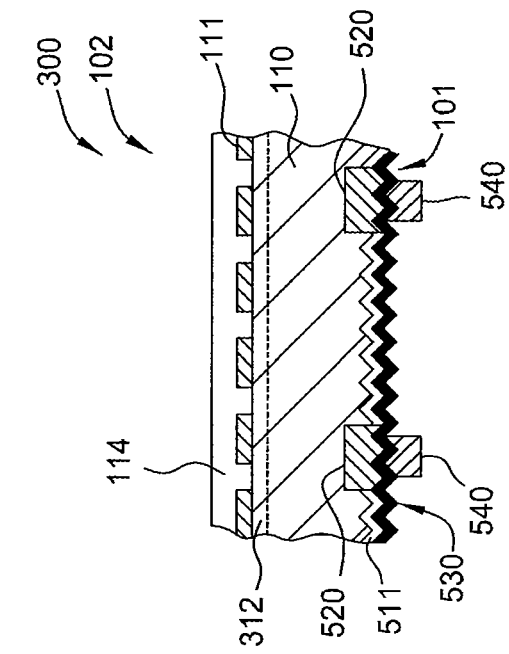
Figure 6:
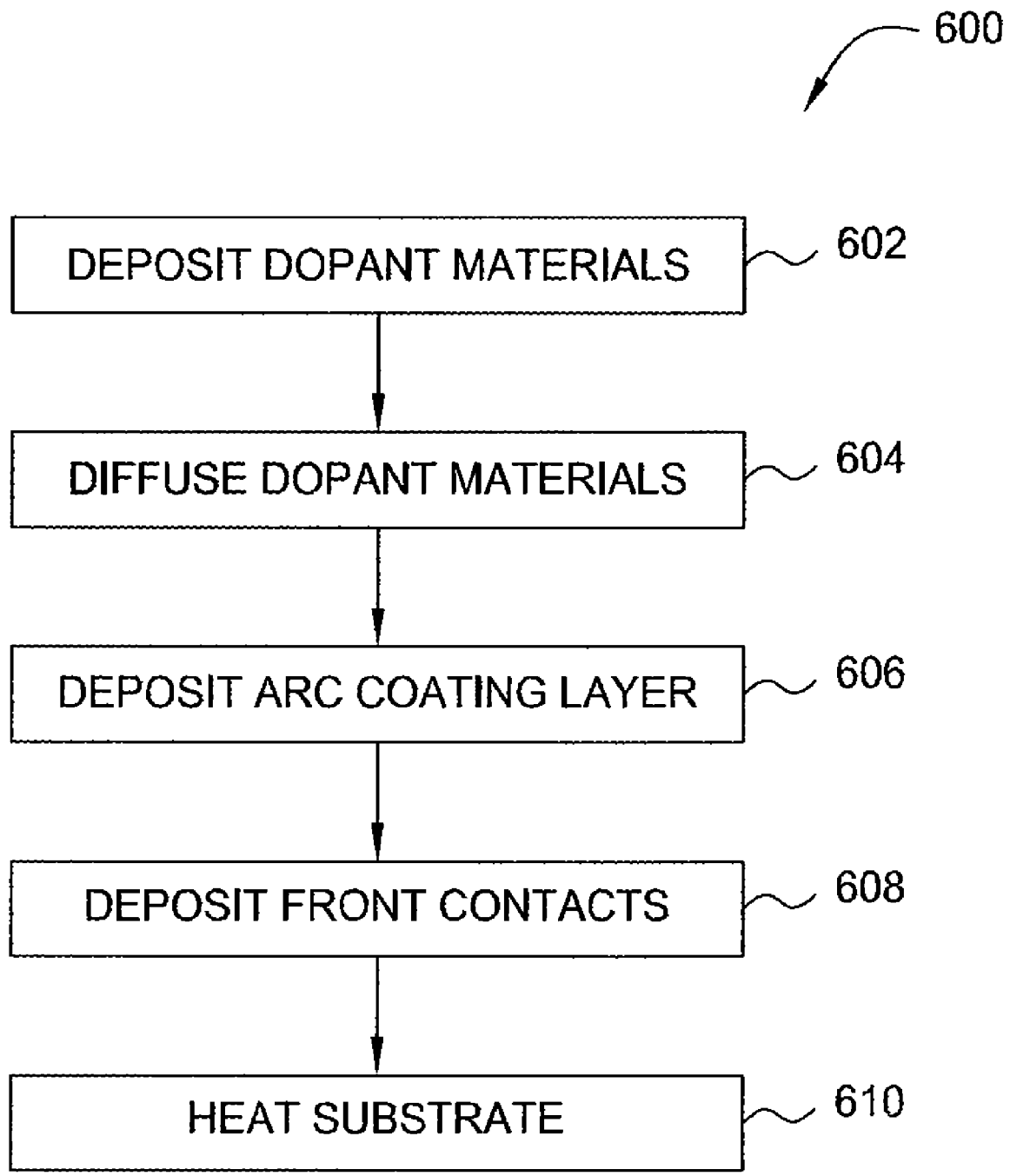
FIG. 6 illustrate a flow chart of methods to form active regions of a solar cell device according to embodiment of the invention.

In another embodiment of the process(es) performed in box 214, a selective emitter structure is formed on the surface of the substrate using the processes illustrated in FIG. 6. The processing sequence 600 illustrated in FIG. 6 corresponds to the processing stages depicted in FIGS. 5A-5D, which are discussed further below in the subsequent section entitled "Selective Emitter Formation Process."

The deposition of the active region described in box 214 may be performed by the first deposition processing module 704 that is positioned within the solar cell production line 700, as previously discussed and shown in FIG. 7. In one embodiment, the first deposition processing module 704 is positioned along the processing flow path downstream of the wet processing module 702 used to perform the process at box 212. In one embodiment, the first deposition processing module 704 is an AKT™ series PECVD chamber available from Applied Materials, Inc., located in Santa Clara, Calif., which is adapted to deposit one or more layers on the surface of one or more substrates at a time to form the active regions. Other processing chambers, such as tube furnace or belt furnace chambers, laser annealing chambers, hot wire chemical vapor deposition (HWCVD) chambers, ion implant/doping chambers, or atomic layer deposition (ALD) chambers, may also be used to practice the present invention.

At box 216, as illustrated in FIGS. 1F and 2, a conducting layer 163 is deposited over the contact layer 114 formed on the substrate 110. In one embodiment, the formed conducting layer 163 is between about 500 Å and about 50,000 Å thick and contains a metal, such as copper (Cu), silver (Ag), gold (Au), tin (Sn), cobalt (Co), rhenium (Rh), nickel (Ni), zinc (Zn), lead (Pb), palladium (Pd), molybdenum (Mo) and/or aluminum (Al) or other metals. In one embodiment, the conducting layer 163 contains two layers that are formed by first depositing an aluminum (Al) layer 161 by a physical vapor deposition (PVD) process, or an evaporation process, and then depositing a nickel vanadium (NiV) capping layer 162 by use of a PVD deposition process.

The deposition of the conducting layer described in box 216 may be performed by a fourth deposition processing module 710 that is positioned within the solar cell production line 700, as shown in FIG. 7. In one embodiment, the fourth deposition processing module 710 is positioned along the processing flow path downstream of the first deposition processing module 704 used to perform the process at box 214. The fourth deposition processing module 710 may include but is not limited to physical vapor deposition (PVD) chambers, chemical vapor deposition (CVD) chambers, plasma enhanced chemical vapor deposition (PECVD) chambers. In one embodiment, the fourth deposition processing module 710 is a sputtering chamber positioned in an ATON™ tool, which is available from Applied Materials, Inc., located in Santa Clara, Calif. Other processing chambers, such as hot wire chemical vapor deposition (HWCVD) chambers, or atomic layer deposition (ALD) chambers, may also be used to practice the present invention.

At box 217, as illustrated in FIG. 2, in one embodiment, an optional cleaning process is performed on the substrate 110 to remove any undesirable oxides formed the front surface 101 of the substrate prior to completing the processes on the front side of the substrate. In one embodiment, the optional cleaning process is performed during or after box 212. In one example, the optional cleaning process is performed before box 216 (FIG. 2). In one embodiment, the clean process may be performed by wetting the substrate with a cleaning solution that is used to remove unwanted oxide material on the surface of the substrate before the subsequent deposition sequence performed. Wetting may be accomplished by spraying, flooding, immersing of other suitable technique. The clean solution may be a dilute HF-last type cleaning solution, an ozonated water solution or other suitable and cost effective cleaning process may be used to clean a silicon containing substrate. In one embodiment, the wet processing module 702 is positioned along the processing flow path downstream of the fourth deposition processing module 710 used to perform the process at box 216. An example of an exemplary system that can be used to perform the cleaning process is further described in the patent application Ser. No. 12/383,350, which is incorporated by reference above.

Following the processes performed prior to and including box 212, box 214, box 216 or box 217, the process in box 218 may be performed on the front surface 101 of the substrate (FIG. 1G). The processes performed in box 218 may require depositing an ARC layer 119 (e.g., silicon nitride) on the front surface 101 of the substrate 110. In one embodiment, as shown in FIG. 1G, the front surface 101 is prepared by first depositing a transparent conductive oxide (TCO) layer 118 and then depositing an ARC layer 119. The TCO layer 118 and ARC layer 119 may be formed using conventional deposition processes, such as physical vapor deposition (PVD) processes and/or chemical vapor deposition (CVD) type processes.

The deposition process described in box 218 may be performed by the fourth deposition processing module 710 that is positioned within the solar cell production line 700, as discussed above and shown in FIG. 7. In one embodiment, the fourth deposition processing module 710 is positioned along the processing flow path downstream of the wet processing module 702 used to perform the process at box 217. In one embodiment, the TCO layer and ARC layer are deposited using a PVD chamber. In another embodiment, the TCO layer is deposited first in a PVD chamber and then transferred to a CVD chamber positioned within the fourth deposition processing module 710. Alternatively, the third deposition processing module 708 may be used to perform the deposition process described in box 218. In such a case, the TCO layer and ARC layer is formed on one or more surfaces of the solar cell substrate using an ATON™ tool available from Applied Materials in Santa Clara, Calif., as discussed above.

At box 220, as one embodiment shown in FIG. 1H, after preparing the front surface 101, one or more conductive front contact lines 123 may be formed thereon using conventional processes to form the front contact structure of the solar cell, for example by first screen printing a metallic paste precursor and heating the metallic paste precursor to a desired temperature to sinter the paste.

In one embodiment, the contact layer 114 and/or conducting layer 163 are optionally patterned to electrically isolate one or more regions of the substrate 110. In one embodiment, the regions of the substrate 110 are electrically isolated by forming channels in the contact layer 114 and/or conducting layer 163 by one or more laser ablation, patterning and dry etching, or other similar techniques. The pattern formed in the contact layer 114 and/or conducting layer 163 may be configured so that desired electrical connections can be formed to desired regions of the solar cell 100.

The deposition of the conductive front contact structure described in box 220 may be performed by the second deposition processing module 706 that is positioned within the solar cell production line 700, as discussed previously and shown in FIG. 7. In one embodiment, the second deposition processing module 706 is positioned along the processing flow path downstream of the fourth deposition processing module 710 used to perform the process at box 218. In one embodiment, the conductive front contact lines may be formed using a screen printing process performed in a Softline™ tool available from Baccini S.p.A., which is owned by Applied Materials, Inc. of Santa Clara, Calif. An example of the second deposition processing module 706 is further disclosed in detail in U.S. patent application Ser. No. 12/418,912 (entitled "NEXT GENERATION SCREEN PRINTING SYSTEM"), filed on Apr. 6, 2009, and U.S. Patent Publication No. 2009/0142880, entitled "SOLAR CELL CONTACT FORMATION PROCESS USING A PATTERNED ETCHANT MATERIAL," filed on Nov. 19, 2008, which are both incorporated herein by reference in their entirety.

Backside Doping Layer Solar Cell Formation Process

Figure 4:
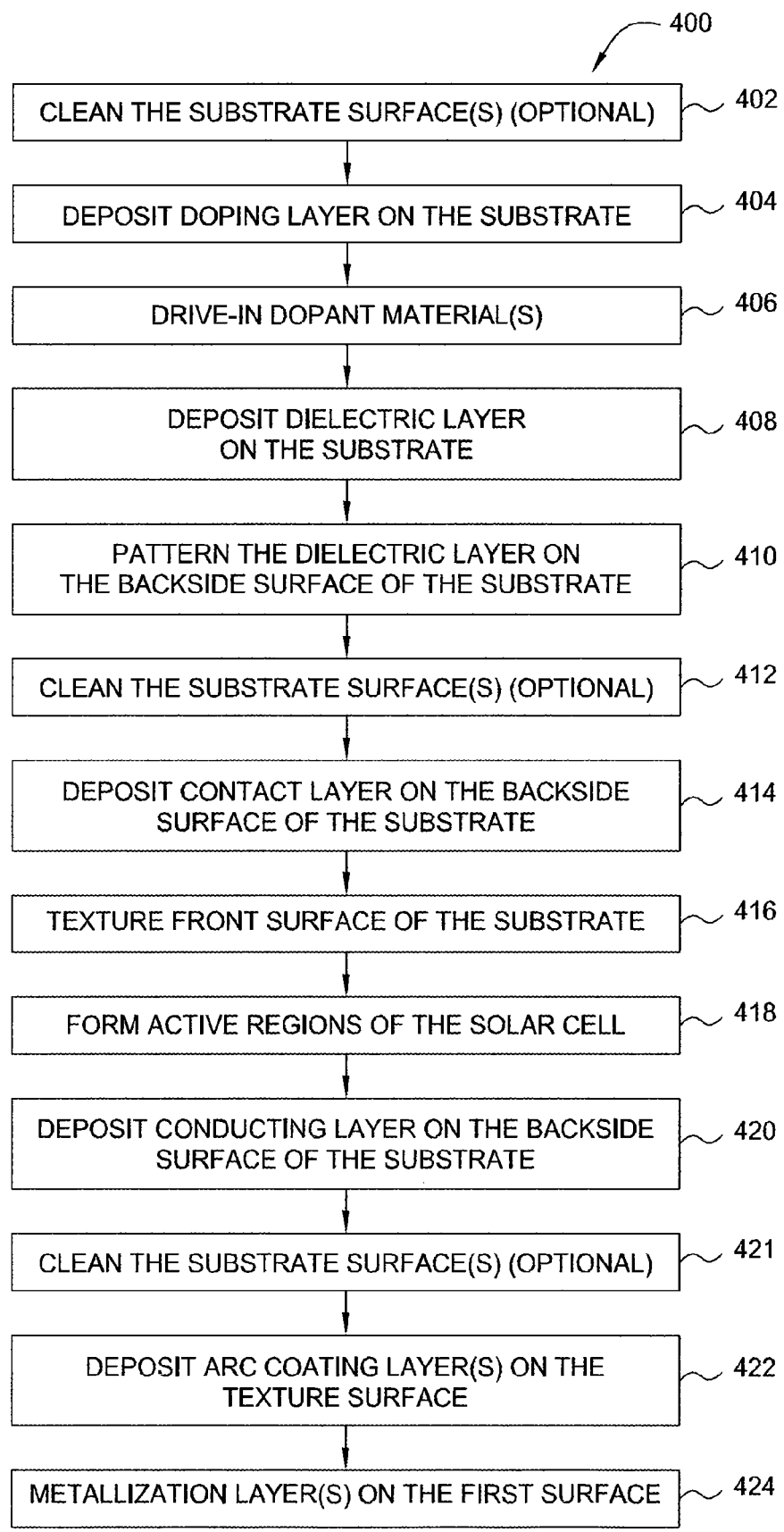
FIG. 4 illustrates a flow chart of methods to metalize a solar cell according to embodiments of the invention.

FIGS. 3A-3J illustrate another embodiment of the present invention showing schematic cross-sectional views of a solar cell substrate 110 during different stages in a processing sequence used to form a contact structure on a back surface 102 of a solar cell device, such as solar cell 300. FIG. 4 illustrates a process sequence 400 used to form the active region(s) and/or contact structure on the solar cell 300. The sequence shown in FIG. 4 corresponds to the stages depicted in FIGS. 3A-3J, which are discussed herein. FIG. 7 is a flow chart of a solar cell production line 700 that is adapted to perform the processing steps illustrated in FIG. 4. It should be noted that the number and sequence of steps illustrated in FIG. 4 are not intended to limiting as to the scope of the invention described herein, since one or more steps or modules can be added, deleted and/or reordered without deviating from the basic scope of the invention described herein.

At box 402, shown in FIG. 4, an optional clean process is performed to remove any undesirable material or roughness from the surfaces of the substrate 110. The cleaning process and hardware for performing the clean process are generally the same as the process(es) performed in conjunction with box 202, which is described above.

After performing the optional cleaning process described in box 402, in one embodiment, as shown in FIGS. 3A and 4, a doping layer 311 is formed on the back surface 102 of the substrate 110. In one aspect, the deposited doping layer 311 is used to form a heavily doped region, such as a $p^+$ or $n^+$ doped region, on the surface of the solar cell substrate on which it is deposited after one or more subsequent thermal processing steps are performed on the substrate. In another aspect, the deposited doping layer 311 is used as a chemically resistant layer that protects the backside of the substrate 110 when a subsequent process, for example, a front side texturing process (box 416) is performed on the front surface 101 of the substrate, as discussed below. In this case, the doping layer 311 may also provide a stable supporting surface for the substrate when the front side regions of a solar cell are formed.

In one embodiment, the doping layer 311 is a silicate glass material that has an n-type or a p-type dopant atom disposed in it, such as a phosphosilicate glass (PSG), borophosphosilicate glass (BPSG) or a borosilicate glass (BSG) layer formed on the substrate. The doping layer 311 may be formed using a conventional spin-on, screen printing, ink jet printing, sprayed-on, roll-on, or other similar type of deposition techniques. In one embodiment, the doping layer 311 is a silicate glass layer that is between about 50 Å and about 20 µm thick. In one example, the doping layer 311 is a BSG layer that is disposed on a p-type substrate 110. In another example, the doping layer 311 is a PSG layer that is disposed on a n-type substrate 110. It should be noted that the discussion of the formation of a silicate glass layer is not intended to be limiting as to the scope of the invention described herein since the doping layer 311 could also be formed using other materials that are chemically resistant to the texture etching process chemistry (box 416) and other cleaning process chemistries, and also provides an amount of a dopant material to the surface of the substrate 110 during one or more thermal processing steps without deviating from the basic scope of the invention described herein. In one embodiment, the doping layer 311 may also be formed on the front surface 101 of the substrate 110. Deposition of doping layer 311 on the front surface 101 may be helpful when forming the backside contact structure, since it can act as a stable support surface that will not be easily scratched or damaged as the handling steps performed during these processes.

The deposition process described in box 404 may be performed by the second deposition processing module 706 that is positioned within the solar cell production line 700, as previously discussed and shown in FIG. 7. In one embodiment, the second deposition processing module 706 is positioned along the processing flow path, which is formed by the automation devices, downstream of the optional wet processing module 702 used to perform the process at box 402. In one embodiment, the doping layer is deposited on the substrate using a screen printing process performed in a Softline™ tool available from Baccini S.p.A., which is owned by Applied Materials, Inc. of Santa Clara, Calif. An example of the second deposition processing module 706 is further disclosed in detail in U.S. Provisional Patent Application Ser. No. 61/102,310 (entitled "NEXT GENERATION SCREEN PRINTING SYSTEM"), filed on Oct. 2, 2008, and U.S. Patent Publication No. 2009/0142880, entitled "SOLAR CELL CONTACT FORMATION PROCESS USING A PATTERNED ETCHANT MATERIAL," filed on Nov. 19, 2008, which are incorporated herein by reference in its entirety.

At box 406, as shown in FIGS. 3B and 4, the substrate is heated to a temperature greater than about 800° C. to cause the dopant in the doping layer 311 to drive-in or diffuse into the surface of the substrate 110 to form a doped region 312 within the substrate 110. FIG. 3B shows the status of the substrate 110 after the heating step has been performed. In one embodiment, the substrate is heated to a temperature between about 800° C. and about 1300° C. for a desired period of time, for example, about 1 minute to 120 minutes. The formed doped region 312 may thus be used to form back surface field diffusions for use in a passivated rear surface point contact solar cell structure.

The drive-in process described in box 406 may be performed by a heat treatment module 712 that is positioned within the solar cell production line 700, as shown in FIG. 7. In one embodiment, the heat treatment module 712 is positioned along the processing flow path, which is formed by the automation devices, downstream of the second deposition processing module 706 used to perform the process at box 404. In one embodiment, the heat treatment module 712 is a rapid thermal annealing (RTA) chamber. Other processing chambers such as an annealing chamber, a tube furnace or belt furnace chamber may also be used to practice the present invention. In one embodiment, the second deposition processing module 706 is a processing chamber disposed in a SoftLine™ tool available from Baccini S.p.A, which is a division of Applied Materials Inc. of Santa Clara, Calif., as discussed above.

Since the processing steps described in box 408 to box 424 are generally the same as the process(es) performed in conjunction with box 204 to box 220, which are discussed above, the individual processing steps will not be re-discussed herein. It should be noted that FIGS. 3C-3J illustrate the substrate configuration during the steps performed within boxes 408 to 424 (e.g., boxes 204-220).

Selective Emitter Formation Process

FIGS. 5A-5D illustrate an alternative embodiment of the present invention, showing schematic cross-sectional views of a solar cell substrate 110 during different stages in a processing sequence performed to form active regions of the solar cell device. The process sequence 600 illustrated in FIG. 6 corresponds to the stages depicted in FIGS. 5A-5D, which can be used to form a selective emitter structure on the front surface 101 of the solar cell device, such as solar cell 300 as previously discussed. In one embodiment, when the processes performed during box 214 or box 418 utilize the steps shown in the processing sequence 600, the processes performed at boxes 406, 421, 422, and 424, or boxes 217, 218 and 220, which are discussed above, need not be additionally performed on the substrate 110. In one embodiment, all of the processing modules used to perform the processing sequence 600 are positioned along the processing flow path downstream of the wet processing module 702 and upstream of the fourth deposition processing module 710 used to perform the process at box 216 or box 420. Therefore, in one embodiment, after performing the processes illustrated in boxes 402-404 and 408-416, or boxes 202-216, the processes contained in the processing sequence 600 are performed at box 214, or box 418.

At box 602, as shown in FIGS. 5A and 6, a first dopant material 510 is deposited on the front surface 101 of the substrate 110. In one embodiment, the first dopant material 510 is deposited or printed in a desired pattern by the use of ink jet printing, rubber stamping, screen printing, or other similar process. The first dopant material 510 may initially be a liquid, paste, or gel that will be used to form a doped region. In some cases, after disposing the first dopant material 510, the substrate is heated to a desirable temperature to assure that the first dopant material 510 will remain on the front surface 101, and cause the dopant material 510 to cure, densify, and/or form a bond with the front surface 101. In one embodiment, the first dopant material 510 is a gel or paste that contains an n-type dopant. Typical n-type dopants used in silicon solar cell manufacturing are elements, such as, phosphorus (P), arsenic (As), or antimony (Sb). In one embodiment, the first dopant material 510 is phosphorous containing dopant paste that is deposited on the front surface 101 of the substrate 110 and the substrate is heated to a temperature of between about 80° C. and about 500° C. In one embodiment, the first dopant material 510 may contain materials selected from a group consisting of polyphosphoric acid, phosphosilicate glass precursors, phosphoric acid ($H_3PO_4$), phosphorus acid ($H_3PO_3$), hypophosphorous acid ($H_3PO_2$), and/or various ammonium salts thereof. In one embodiment, the first dopant material 510 is a gel or paste that contains between about 6 and about 30 atomic % of phosphorous.

The process described in box 602 may be performed by the second deposition processing module 706 that is positioned within the solar cell production line 700, as previously discussed and shown in FIG. 7. In one embodiment, the second deposition processing module 706 is positioned along the processing flow path downstream of the wet processing module 702 used to perform the process at box 212 or box 416. In one embodiment, the doping layer is deposited on the substrate using a screen printing process performed in a Soft-line™ tool available from Baccini S.p.A., which is owned by Applied Materials, Inc. of Santa Clara, Calif. An example of the second deposition processing module 706 is further disclosed in detail in U.S. Provisional patent application Ser. No. 12/418,912 (entitled "NEXT GENERATION SCREEN PRINTING SYSTEM"), filed on Apr. 6, 2009, and U.S. Patent Publication No. 2009/0142880, entitled "SOLAR CELL CONTACT FORMATION PROCESS USING A PATTERNED ETCHANT MATERIAL," filed on Nov. 19, 2008, which are incorporated by reference above.

At box 604, as shown in FIGS. 5B and 6, the substrate is heated to a temperature greater than about 750° C. to causes the doping elements in the first dopant material 510 to diffuse into the front surface 101 of the substrate 110, thereby forming a first doped region 520 within the substrate 110. In one embodiment, as noted above, the processes performed at box 406 need not be performed in addition to the processes performed at box 604, since the dopant atoms in the doping layer 311 and the first dopant material 510 can be driven into the surfaces of the substrate 110 at the same time during the processes performed at box 604. Each of the formed first doped regions 520 can thus be used as heavily doped region where a good electrical connection can be made to the front surface of the solar cell 300. In one example, it is desirable for the formed first doped region 520 to have a sheet resistance between about 10-50 Ohms per square. In one embodiment of the processes performed at box 604, the substrate is heated to a temperature between about 750° C. and about 1300° C. in the presence of nitrogen ($N_2$), oxygen ($O_2$), hydrogen ($H_2$), air, or combinations thereof for between about 1 minute and about 120 minutes. In one example, the substrate is heated in a rapid thermal annealing (RTA) chamber in a nitrogen ($N_2$) rich environment to a temperature of about 1000° C. for about 5 minutes.

In one embodiment of the processes performed in box 604, the regions of the front surface 101 of the substrate 110 between the deposited first dopant material 510 are doped with a desired dopant atom (e.g., n-type dopant) to form a doped region 511. In one embodiment, during a portion of the process of driving in the first dopant material 510 into the front surface 101 of the substrate, the front surface is exposed to a dopant containing vapor or gas to form the doped region 511. In one example, at least a portion of the dopant containing vapor is created by the vaporization of some of the first dopant material 510 during the thermal processing. In another example, the front surface 101 is exposed to phosphoric acid during thermal processing to form the doped region 511 in an n-type solar cell substrate. In yet another example, the front surface 101 of the substrate is exposed to $POCl_3$, or other desirable dopant containing gas while the substrate is thermally processed in a tube furnace. Although not shown here, one will note that the refractory metal and metal alloy, or the capping layer used in the contact layer 114 (as described previously) is believed to advantageously form a reliable mask that can prevent the back surface 102 from being doped with any unwanted dopant containing vapors that is used to form, or is a by-product of forming, the first doped region 520 and the doped region 511. In one example, it is desirable for the formed doped region 511 to have a sheet resistance between about 80-200 Ohms per square.

The drive-in process described in box 604 may be performed by the heat treatment module 712 that is positioned within the solar cell production line 700, as discussed previously and shown in FIG. 7. In one embodiment, the heat treatment module 712 is a rapid thermal annealing (RTA) chamber such as a Vantage Radiance Plus™ RTP chamber available from Applied Materials Inc. of Santa Clara, Calif.

Other processing chambers such as an annealing chamber, a tube furnace or belt furnace chamber may also be used to practice the present invention. In one embodiment, the second deposition processing module 706 is a processing chamber contained in a processing module disposed within a SoftLine™ tool available from Baccini S.p.A, which is a division of Applied Materials Inc. of Santa Clara, Calif., as discussed above.

At box 606, as shown in FIGS. 5C and 6, an antireflection layer 530 is formed on the front surface 101 of the substrate. In one embodiment, the antireflection layer 530 comprises a thin passivation/antireflection layer (e.g., silicon nitride, silicon oxide). While FIG. 5C illustrates an antireflection layer 530 that is a single layer this configuration is not intended to be limiting as to the scope of the invention described herein, and is only intended to illustrate one example of an antireflection layer.

The deposition of the antireflection layer described in box 606 may be performed by the fourth deposition processing module 710 that is positioned within the solar cell production line 700, as discussed above and shown in FIG. 7. In one embodiment, the antireflection layer is deposited using a PVD chamber or a CVD chamber. Alternatively, the third deposition processing module 708 may be used to perform the deposition process described in box 606. In such a case, the antireflection layer is formed on one or more surfaces of the solar cell substrate using an ATON™ tool available from Applied Materials in Santa Clara, Calif., as discussed above.

At box 608, as illustrated in FIGS. 5D and 6, a conducting layer 540 is deposited over the antireflection layer 530. In one embodiment, the formed conducting layer 540 is between about 2000 angstroms (Å) and about 50,000 angstroms (Å) thick and contains a metal. In one embodiment, the formed conducting layer 540 is formed from a metal containing paste, such as silver (Ag) containing paste that is screen printed on the front surface 101 of the substrate. In one embodiment, a desired pattern of the conducting layer 540 is deposited over the formed first doped regions 520, so that the conducting layer 540 will form a good electrical contact with the first doped regions 520 after a subsequent thermal process is performed at box 610. In one embodiment, the conducting layer 540 is a silver containing material that is deposited in a desired pattern by use of a screen printing process, ink jet printing, or other similar process.

The deposition of the conducting layer described in box 608 may be performed by the fourth deposition processing module 710 that is positioned within the solar cell production line 700, as discussed previously and shown in FIG. 7. The fourth deposition processing module 710 may include but is not limited to physical vapor deposition (PVD) chambers, sputtering chambers, chemical vapor deposition (CVD) chambers, plasma enhanced chemical vapor deposition (PECVD) chambers. In one embodiment, the conducting layer is deposited using a PVD chamber available from Applied Materials, Inc., located in Santa Clara, Calif. Other processing chambers, such as hot wire chemical vapor deposition (HWCVD) chambers, ion implant/doping chambers, atomic layer deposition (ALD) chambers, or rapid thermal oxidation (RTO) chamber, etc., may also be used to practice the present invention.

At box 610, the substrate is generally heated to a temperature greater than 400° C. and/or less than about 800° C. to causes the conducting layer 540 to densify and/or diffuse into the front surface 101 of the substrate 110 to form a desirable Ohmic-contact with portions of the first doped region 520. In one embodiment of the processes performed at box 610, the substrate is heated to a temperature between about 400° C. and about 500° C. in the presence of nitrogen ($N_2$), oxygen ($O_2$), hydrogen ($H_2$), air, or combinations thereof for between about 1 minute and about 120 minutes. In one embodiment, the substrate is heated in the second deposition processing module 706 that is positioned within the solar cell production line 700, as shown in FIG. 7. In one example, the second deposition processing module 706 is a processing chamber disposed within a SoftLine™ tool available from Baccini S.p.A, which is a division of Applied Materials Inc. of Santa Clara, Calif., as discussed above. Alternatively, the heat treatment module 712 that is positioned within the solar cell production line 700 may be used to heat the substrate. In such a case, an annealing chamber, a tube furnace or belt furnace chamber may be used. The embodiments described herein have advantage over other conventional techniques, since the formed electrical connection between the conducting layer 540 will have a low contact resistance and will not damage the formed solar cell junction by "spiking" through formed emitter to the underlying p-type material. In the configurations disclosed herein the conducting layers 540 are fired through dielectric layer using a firing furnace module 714 that is positioned within the solar cell production line 700. In one example, the firing furnace module 714 is a furnace that is adapted to heat the substrate to a desired temperature to form a desirable contact with the patterned metal layers formed on the substrate surfaces. An example of an exemplary firing furnace module 714 is further disclosed in detail in U.S. Provisional Patent Application Ser. No. 61/157,179 (entitled "CRYSTALLINE SILICON SOLAR CELL PRODUCTION LINE HAVING A WAFER SAWING MODULE"), filed on Mar. 3, 2009, which is incorporated herein by reference above.

In one embodiment, after performing the processes in the processing sequence 600, the solar cell processing sequence 600 continues on with the processing box 420, which are discussed above.

Although the processing sequence 600 provided above is described to be an alternative manner of forming active regions of the solar cell device, such as solar cell 300, it is contemplated that the similar processing sequence 600 is applicable to the solar cell 100 in a manner as described above.

Alternate Processing Sequence

FIGS. 8A and 8B illustrate an alternative embodiment of the present invention, showing schematic cross-sectional views of a solar cell substrate 110 during different stages in a processing sequence performed to form a desired pattern of exposed regions 811 that can be used to form a connection between the backside contact structure 127 (FIGS. 1C and 3E) and the substrate surface 816. In one embodiment, the processes discussed below may be used to replace the patterning process performed in box 206 or box 410 as discussed previously.

FIG. 8A shows the status of the solar cell 100 before patterning process is performed, where a dielectric layer 111 is formed on a front surface 101 and a back surface 102 of the substrate 110. In FIG. 8B, the dielectric layer 111 formed on the back surface 102 of the substrate is etched using a deposited etchant material that comprises a dopant atom. In one embodiment, an etchant material is selectively deposited on the dielectric layer 111 by use of a conventional ink jet printing, rubber stamping, screen printing, or other similar process. In one embodiment, the etching material comprises ammonium fluoride ($NH_4F$) and a dopant containing material. In configurations where the substrate 110 comprises an n-type silicon substrate, the doping atom may include a phosphorous (P) containing dopant material. Thereafter, the substrate is heated to a temperature that will allow the etching material to etch the dielectric layer 111 and also allow the dopant atoms found in the etching material to be driven into the exposed regions 811 of the substrate 110 to form doped regions 812. In this case, the dopant atoms in the etching material can be used to form heavily doped regions 812 in the substrate 110 so that a high quality electrical connection can be formed between the substrate surface 816 (FIG. 1C) and the backside contact layer 127 (FIGS. 1C and 3E).

While the foregoing is directed to embodiments of the present invention, other and further embodiments of the invention may be devised without departing from the basic scope thereof, and the scope thereof is determined by the claims that follow.

What is claimed is:

1. A method of forming a solar cell device, comprising:
   forming a first dielectric layer on a back surface of a substrate;
   removing portions of the first dielectric layer from the back surface to form a plurality of exposed regions of the substrate;
   depositing a metal layer over at least a portion of the first dielectric layer, wherein the metal layer is in electrical communication with at least one of the exposed regions of the substrate;
   texturing a front surface of the substrate after depositing the metal layer; and
   depositing at least one intrinsic silicon containing layer on the front surface of the substrate after texturing the front surface.

2. The method of claim 1, wherein the metal layer comprises a metal or a metal alloy that is selected from a group consisting of titanium (Ti), tantalum (Ta), tungsten (W), molybdenum (Mo), titanium nitride (TiN), tantalum nitride (TaN), tungsten nitride (WN), and molybdenum nitride (MoN).

3. The method of claim 1, further comprising depositing an ARC layer on the front surface, wherein the ARC layer comprises silicon nitride (SiN).

4. The method of claim 1, wherein removing portions of the first dielectric layer from the back surface is performed by selectively etching the first dielectric layer to form the plurality of exposed regions of the substrate.

5. The method of claim 4, wherein the etching the first dielectric layer comprises exposing the substrate to an etching chemistry comprising ammonium fluoride.

6. The method of claim 1, wherein the texturing of the front surface comprises exposing the substrate to an etch chemistry comprising an etchant material selected from a list consisting of ammonium fluoride, hydrogen fluoride, potassium hydroxide, and hydrofluoric acid.

7. The method of claim 6, wherein the etchant material further comprises polyethylene glycol.

8. The method of claim 1, further comprising depositing a contact layer on at least a portion of the first dielectric layer prior to depositing the metal layer, wherein the contact layer comprises a metal that is selected from a group consisting of copper (Cu), silver (Ag), gold (Au), tin (Sn), cobalt (Co), rhenium (Rh), nickel (Ni), zinc (Zn), lead (Pb), palladium (Pd), tungsten (W), titanium (Ti), tantalum (Ta), molybdenum (Mo) and aluminum (Al).

9. The method of claim 1, further comprising forming a second dielectric layer on the front surface of the substrate before texturing the front surface of the substrate.

10. The method of claim 1, further comprising:
    forming a doping layer on the back surface of the substrate prior to depositing the first dielectric layer on the back surface of the substrate; and
    heating the doping layer and the substrate to a temperature greater than about 800 ° C. to cause a dopant in the doping layer to diffuse into the back surface of the substrate.

11. The method of claim 10, wherein the doping layer comprises silicate glass material having an n-type or a p-type dopant atom disposed therein.

12. The method of claim 11, wherein silicate glass comprises a phosphosilicate glass (PSG), a borophosphosilicate glass (BPSG), or a borosilicate glass (BSG).

13. The method of claim 10, wherein forming the doping layer on the back surface of the substrate is performed on a crystalline solar cell substrate.

14. The method of claim 1, further comprising:
    depositing a doped silicon containing layer on the intrinsic silicon containing layer.

15. The method of claim 10, wherein the dopant is diffused into the back surface of the substrate to form a heavily doped region.

* * * * *